United States Patent
Chuang et al.

(10) Patent No.: US 8,785,971 B2
(45) Date of Patent: Jul. 22, 2014

(54) TRANSIENT VOLTAGE SUPPRESSOR WITHOUT LEAKAGE CURRENT

(75) Inventors: Che-Hao Chuang, Hsinchu County (TW); Kun-Hsien Lin, Hsinchu (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 268 days.

(21) Appl. No.: 13/303,946

(22) Filed: Nov. 23, 2011

(65) Prior Publication Data
US 2013/0127007 A1 May 23, 2013

(51) Int. Cl.
*H01L 23/58* (2006.01)
*H01L 27/02* (2006.01)
*H01L 29/866* (2006.01)
*H01L 29/861* (2006.01)

(52) U.S. Cl.
CPC ........... *H01L 27/0296* (2013.01); *H01L 29/866* (2013.01); *H01L 29/8613* (2013.01)
USPC ................... 257/173; 257/E29.007; 257/111; 257/112; 257/106; 257/603; 257/546; 257/E29.335; 257/492; 361/90; 361/91.1; 361/91.5

(58) Field of Classification Search
None
See application file for complete search history.

(56) References Cited

U.S. PATENT DOCUMENTS

| | | | |
|---|---|---|---|
| 6,586,317 B1 * | 7/2003 | Vashchenko et al. | 438/510 |
| 6,867,436 B1 | 3/2005 | Matteson et al. | |
| 2008/0203534 A1 * | 8/2008 | Xu et al. | 257/577 |
| 2008/0290462 A1 | 11/2008 | Schmenn et al. | |
| 2010/0244090 A1 | 9/2010 | Bobde et al. | |
| 2010/0276779 A1 | 11/2010 | Guan et al. | |
| 2011/0212595 A1 * | 9/2011 | Hu et al. | 438/430 |
| 2012/0091504 A1 * | 4/2012 | Davis et al. | 257/146 |

FOREIGN PATENT DOCUMENTS

| | | |
|---|---|---|
| TW | 419808 | 1/2001 |
| TW | 578293 | 3/2004 |
| TW | I340453 | 4/2004 |
| TW | I233688 | 6/2005 |
| TW | I336946 | 2/2011 |

* cited by examiner

*Primary Examiner* — Fei Fei Yeung Lopez
(74) *Attorney, Agent, or Firm* — Muncy, Geissler, Olds & Lowe, P.C.

(57) ABSTRACT

A transient voltage suppressor without leakage current is disclosed, which comprises a P-substrate. There is an N-type epitaxial layer formed on the P-substrate, and a first N-heavily doped area, a first P-heavily doped area, an electrostatic discharge (ESD) device and at least one deep isolation trench are formed in the N-epitaxial layer. A first N-buried area is formed in the bottom of the N-epitaxial layer to neighbor the P-substrate and located below the first N-heavily doped area and the first P-heavily doped area. The ESD device is coupled to the first N-heavily doped area. The deep isolation trench is not only adjacent to the first N-heavily doped area, but has a depth greater than a depth of the first N-buried area, thereby separating the first N-buried area and the ESD device.

8 Claims, 7 Drawing Sheets

TRANSIENT VOLTAGE SUPPRESSOR WITHOUT LEAKAGE CURRENT

BACKGROUND OF THE INVENTION

1. Field of the Invention

The present invention relates to a transient voltage suppressor, particularly to a transient voltage suppressor without leakage current.

2. Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. Currently, all consumer electronics are expected to pass the ESD test requirement of IEC 61000-4-2 standard. TVS (Transient Voltage Suppressor) is generally designed to bypass the ESD energy, so that the electronic systems can be prevented from ESD damages.

Figure 1:
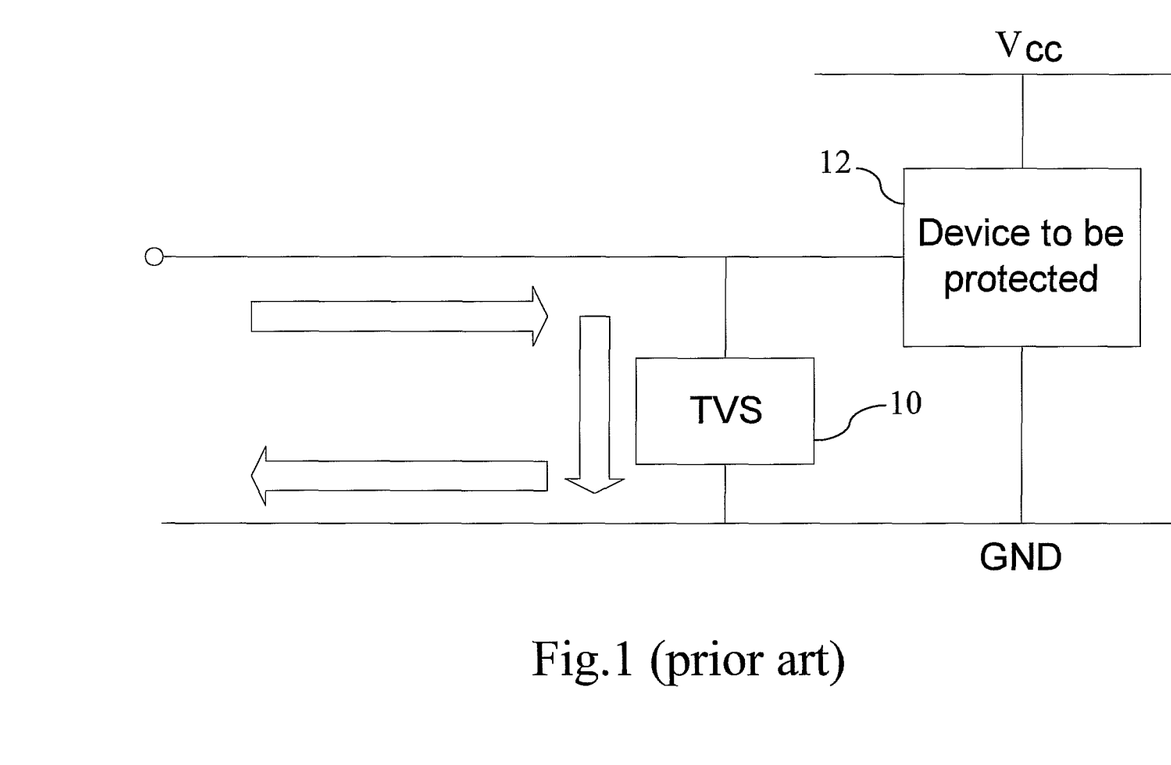
FIG. 1 is a circuit diagram showing a transient voltage suppressor connected with a protected circuit according to the prior art.

The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices 10.

Figure 2:
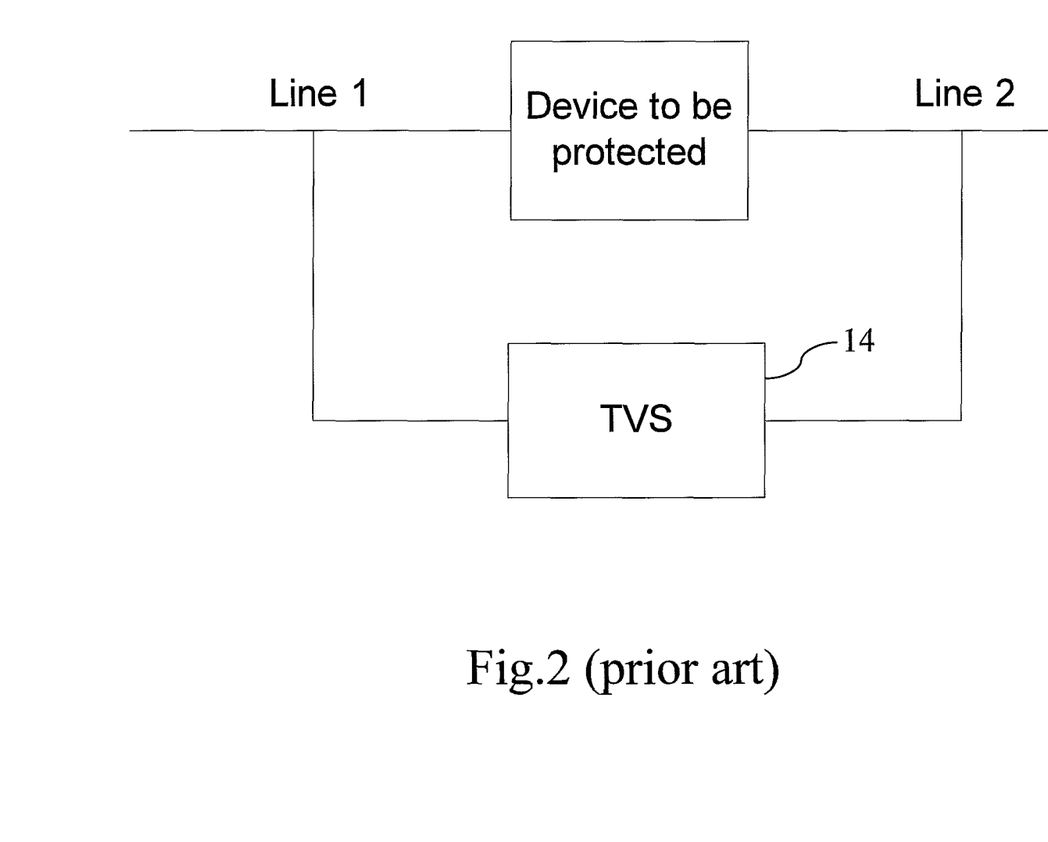
FIG. 2 is a circuit diagram showing a transient voltage suppressor with two terminals connected to a protected circuit according to the prior art.

For differential pair line to line application, such as Ethernet, bi-directional TVS with floating ground for ESD protection is necessary because the voltage polarity between two lines can be positive or negative. The schematic is shown in FIG. 2. However, the leakage current of TVS 14 is increased for substrate floating in integrated circuit. Therefore, how to reduce leakage current of TVS device 14 when ground is floating is a challenge.

To overcome the abovementioned problems, the present invention provides a transient voltage suppressor without leakage current, so as to solve the abovementioned problems of the prior art.

SUMMARY OF THE INVENTION

A primary objective of the present invention is to provide a transient voltage suppressor, which forms an N-type buried area in the bottom of an N-type epitaxial layer. The N-type buried area can decrease the β gain of the parasitic PNP bipolar junction transistor (BJT), thereby reduce the leakage current.

To achieve the abovementioned objectives, the present invention provides a transient voltage suppressor without leakage current, which comprises a P-type substrate. There is an N-type epitaxial layer formed on the P-type substrate, and a first N-type heavily doped area and a first P-type heavily doped area are formed in the N-type epitaxial layer. A first N-type buried area is formed in the bottom of the N-type epitaxial layer to neighbor the P-type substrate and located below the first N-type heavily doped area and the first P-type heavily doped area. In addition, an electrostatic discharge (ESD) device is formed in the N-type epitaxial layer and coupled to the first N-type heavily doped area. At least one deep isolation trench adjacent to the first N-type heavily doped area is formed in the N-type epitaxial layer, has a depth greater than a depth of the first N-type buried area, and separates the first N-type buried area and the ESD device.

Below, the embodiments are described in detail in cooperation with the drawings to make easily understood the technical contents, characteristics and accomplishments of the present invention.

DETAILED DESCRIPTION OF THE INVENTION

Figure 3:
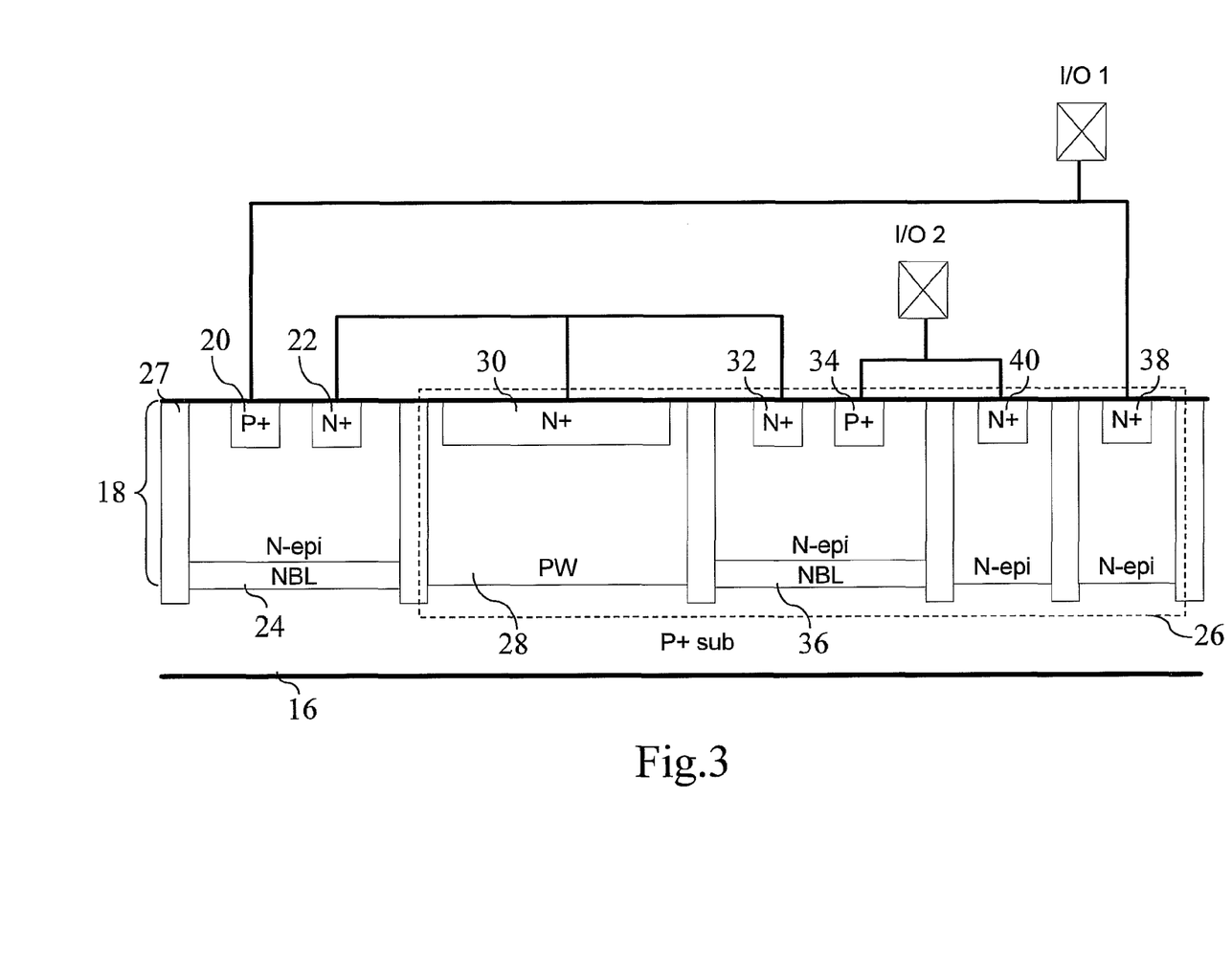
FIG. 3 is a sectional view schematically showing a transient voltage suppressor according to the first embodiment of the present invention.

The present invention comprises an electrostatic discharge (ESD) device having four kinds of structures. The first embodiment is firstly described as below. Refer to FIG. 3. A transient voltage suppressor of the present invention comprises a P-type heavily doped substrate 16 used as a P-type substrate, wherein the P-type heavily doped substrate 16 is floating. An N-type lightly doped epitaxial layer 18 used as an N-type epitaxial layer is formed on the P-type heavily doped substrate 16, and a first N-type heavily doped area 22 and a first P-type heavily doped area 20 are formed in the N-type lightly doped epitaxial layer 18. The N-type lightly doped epitaxial layer 18 has high resistivity to reduce the junction capacitance of the device in high speed application. In order to reduce the leakage current from the parasitic vertical PNP bipolar, a first N-type buried area 24 is formed in the bottom of the N-type lightly doped epitaxial layer 18 to neighbor the P-type heavily doped substrate 16 and located below the first N-type heavily doped area 22 and the first P-type heavily doped area 20. In addition, an ESD device 26 and at least one deep isolation trench 27 are both formed in the N-type lightly doped epitaxial layer 18. The ESD device 26 is coupled to the first N-type heavily doped area 22, and the deep isolation trench 27 having a depth greater than a depth of the first N-type buried area 24 is adjacent to the first N-type buried area 24 to separate the first N-type buried area 24 and the ESD device 26. The deep isolation trench 27 can avoid unexpected effect by parasitic device.

The ESD device 26 further comprises a clamp P-type well 28 formed in the N-type lightly doped epitaxial layer 18, and a second N-type heavily doped area 30 is formed in the clamp P-type well 28. Additionally, a third N-type heavily doped area 32 and a second P-type heavily doped area 34 are formed in the N-type lightly doped epitaxial layer 18, wherein the third N-type heavily doped area 32 is coupled to the first and second N-type heavily doped areas 22 and 30. In order to reduce the leakage current from the parasitic vertical PNP bipolar, a second N-type buried area 36, together with the first N-type buried area 24, are located on the same horizontal plane and formed in the bottom of the N-type lightly doped epitaxial layer 18 to neighbor the P-type heavily doped substrate 16, wherein the second N-type buried area 36 is located below the third N-type heavily doped area 32 and the second P-type heavily doped area 34. A fourth N-type heavily doped area 38 and a fifth N-type heavily doped area 40 are formed in the N-type lightly doped epitaxial layer 18. The fourth N-type heavily doped area 38 and the first P-type heavily doped area 20 are coupled to the first I/O pin. The fifth N-type heavily doped area 40 and the second P-type heavily doped area 34 are coupled to the second I/O pin. The first I/O pin and second I/O pin can be connected to line 1 and line 2 for differential pair protection. The depth of the deep isolation trench 27 is greater than depths of the second N-type buried area 36 and the clamp P-type well 28, wherein the deep isolation trench 27 is further adjacent to the second N-type buried area 36 to separate the first and second N-type buried areas 24 and 36, the clamp P-type well 28, the fourth and fifth N-type heavily doped areas 38 and 40.

Figure 4:
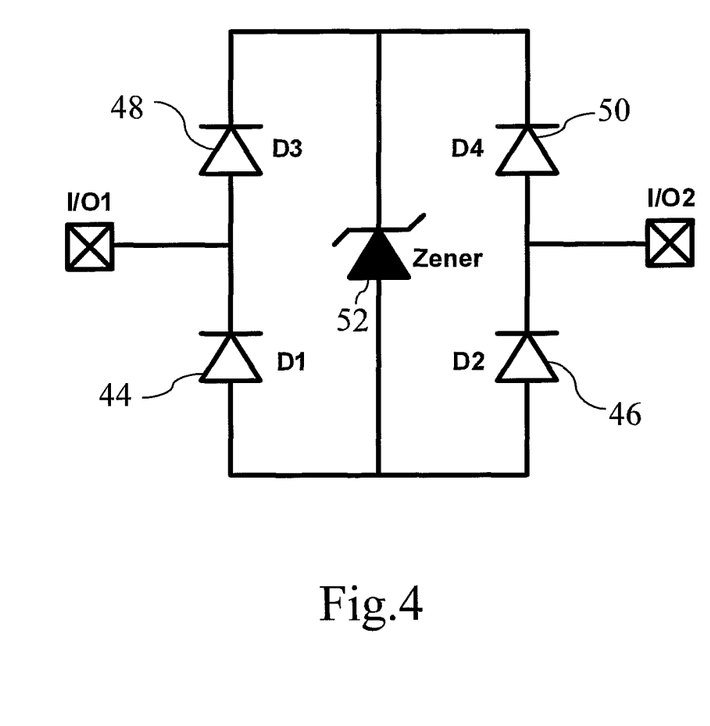
FIG. 4 is a circuit diagram schematically showing a transient voltage suppressor according to the first embodiment of the present invention.

Refer to FIG. 3 and FIG. 4. FIG. 4 is an equivalent circuit of FIG. 3. The fourth N-type heavily doped area 38, the N-type lightly doped epitaxial layer 18 and the P-type heavily doped substrate 16 form the first diode 44. The fifth N-type heavily doped area 40, the N-type lightly doped epitaxial layer 18 and the P-type heavily doped substrate 16 form the second diode 46. The first P-type heavily doped area 20 and the N-type lightly doped epitaxial layer 18 form the third diode 48. The second P-type heavily doped area 34 and the N-type lightly doped epitaxial layer 18 form the fourth diode 50. The clamp P-type well 28 and the second N-type heavily doped area 30 form a Zener diode 52.

When the first I/O pin receives the positive ESD pulse and the second I/O pin is grounded, the ESD current flows from the first P-type heavily doped area 20 to the fifth N-type heavily doped area 40 through the N-type lightly doped epitaxial layer 18, the first N-type heavily doped area 22, the second N-type heavily doped area 30, the clamp P-type well 28, the P-type heavily doped substrate 16 and the N-type lightly doped epitaxial layer 18. At the same time, the leakage current is induced by the first PNP bipolar junction transistor (BJT) formed by the first P-type heavily doped area 20, the N-type lightly doped epitaxial layer 18 and the P-type heavily doped substrate 16. However, the first N-type buried area 24 can decrease the β gain of the first PNP BJT to reduce the leakage current greatly. Similarly, when the second I/O pin receives the positive ESD pulse and the first I/O pin is grounded, the ESD current flows from the second P-type heavily doped area 34 to the fourth N-type heavily doped area 38 through the N-type lightly doped epitaxial layer 18, the third N-type heavily doped area 32, the second N-type heavily doped area 30, the clamp P-type well 28, the P-type heavily doped substrate 16 and the N-type lightly doped epitaxial layer 18. At the same time, the leakage current is induced by the second PNP BJT formed by the second P-type heavily doped area 34, the N-type lightly doped epitaxial layer 18 and the P-type heavily doped substrate 16. However, the second N-type buried area 36 can also decrease the fi gain of the second PNP BJT to reduce the leakage current greatly.

Figure 5:
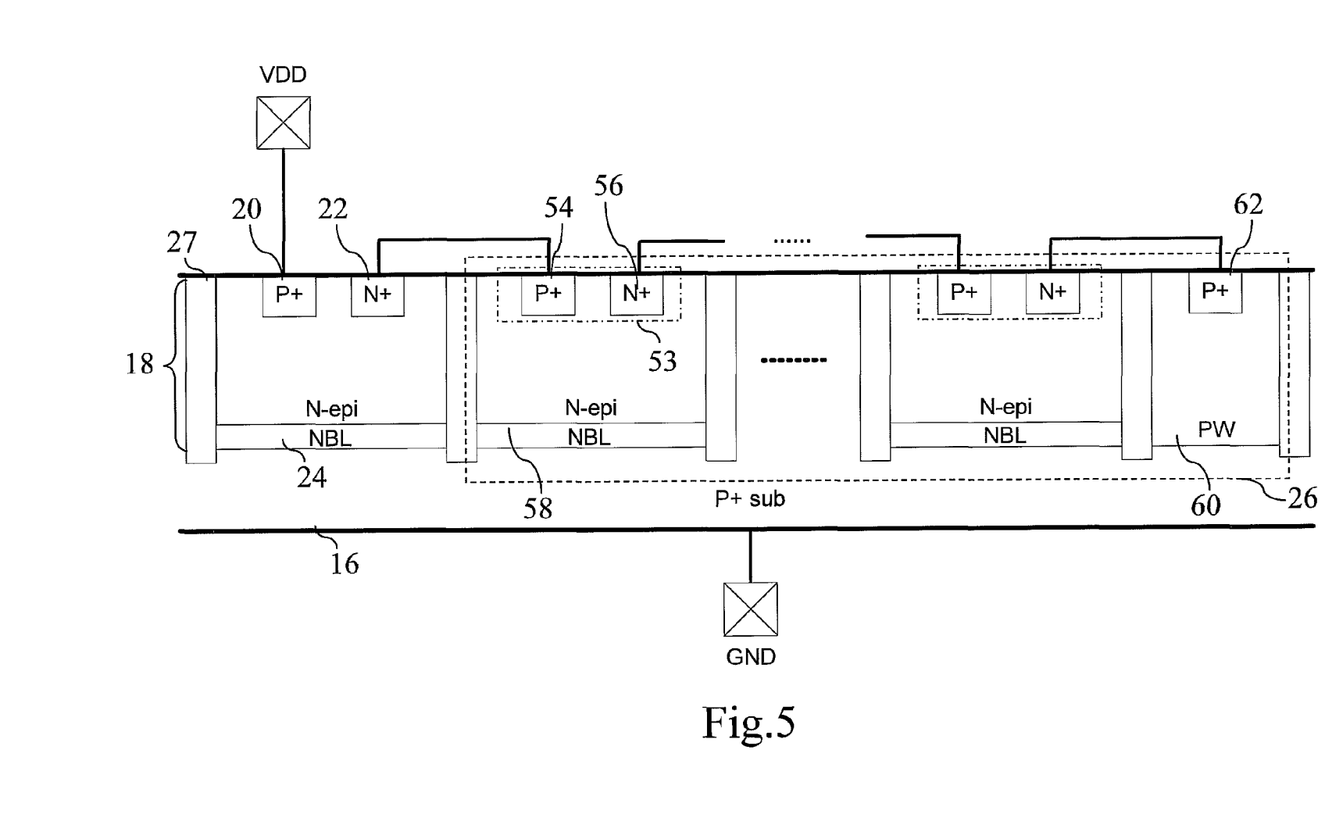
FIG. 5 is a sectional view schematically showing a transient voltage suppressor according to the second embodiment of the present invention.

Below is the description of the second embodiment. The second embodiment is different from the first embodiment in the ESD device 26. Refer to FIG. 5. The ESD device 26 further comprises a plurality of diode structures 53 formed in the N-type lightly doped epitaxial layer 18. Each diode structure 53 further comprises a third P-type heavily doped area 54 and a sixth N-type heavily doped area 56 formed in the N-type lightly doped epitaxial layer 18. Each diode structure 53 is cascaded via coupling third P-type heavily doped area 54 and the sixth N-type heavily doped area 56. The first N-type buried area 24, together with, a plurality of third N-type buried areas 58, are located on a horizontal plane and formed in the bottom of the N-type lightly doped epitaxial layer 18 to neighbor the P-type heavily doped substrate 16. Each third N-type buried area 58 is located below one third P-type heavily doped area 54 and one sixth N-type heavily doped area 56.

Besides, a contact P-type well 60 is formed in the N-type lightly doped epitaxial layer 18, and a fourth P-type heavily doped area 62 is formed in the contact P-type well 60. The fourth P-type heavily doped area 62 is coupled to the last one of the sixth N-type heavily doped areas 56, and the first one of the third P-type heavily doped areas 54 is coupled to the first N-type heavily doped area 22. The depth of the deep isolation trench 27 is greater than the depth of each third N-type buried area 58, wherein the deep isolation trench 27 is further adjacent to each the third N-type buried area 58 to separate the fourth P-type heavily doped area 62, the first N-type buried area 24 and each third N-type buried area 58. The first P-type heavily doped area 20 is coupled to a high-voltage pin VDD, and the P-type heavily doped substrate 16 is coupled to a grounded pin GND. Alternatively, the first P-type heavily doped area 20 is coupled to the third I/O pin, and the P-type heavily doped substrate 16 is coupled to the fourth I/O pin. The third I/O pin and the fourth I/O pin can be connected to line 1 and line 2 for differential pair protection. The second embodiment can be used as a diode string without leakage current. The diode string can be also used to replace the zener diode 52 in FIG. 4 for low operating voltage application.

When the first P-type heavily doped area 20 receives the positive ESD pulse of the high-voltage pin VDD, the ESD current flows from the first P-type heavily doped area 20 to the P-type heavily doped substrate 16 through the N-type lightly doped epitaxial layer 18, the first N-type heavily doped area 22, the diode structures 53, the fourth P-type heavily doped area 62 and the contact P-type well 60. At the same time, the leakage current is induced by the second PNP BJT formed by the first P-type heavily doped area 20, the N-type lightly doped epitaxial layer 18 and the P-type heavily doped substrate 16, and the leakage current is induced by the third PNP BJTs each formed by the third P-type heavily doped areas 54, the N-type lightly doped epitaxial layer 18 and the P-type heavily doped substrate 16. However, the first N-type buried area 24 and the third N-type buried areas 58 can respectively decrease the β gain of the first PNP BJT and third PNP BJTs to reduce the leakage current greatly.

Figure 6:
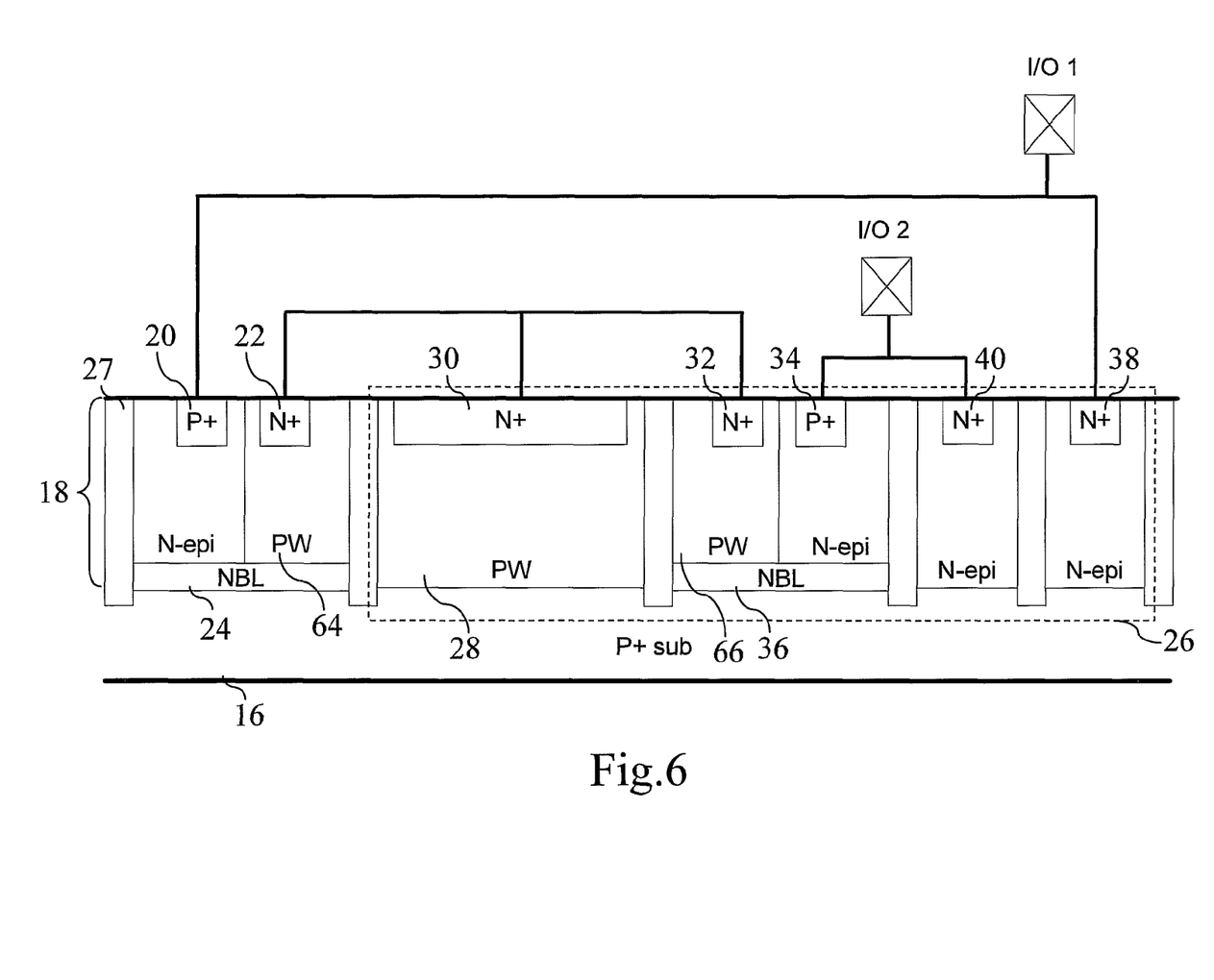
FIG. 6 is a sectional view schematically showing a transient voltage suppressor according to the third embodiment of the present invention.

Refer to FIG. 6. Below is the description of the third embodiment. The third embodiment is different from the first embodiment in that he third embodiment further comprises a first P-type well 64 and a second P-type well 66. The first P-type well 64 is formed in the N-type lightly doped epitaxial layer 18 and located above the first N-type buried area 24, wherein the first N-type heavily doped area 22 is formed in the first P-type well 64. The second P-type well 66 is formed in the N-type lightly doped epitaxial layer 18 and located above the second N-type buried area 36, wherein the third N-type heavily doped area 32 is formed in the second P-type well 66. In the third embodiment, the first P-type heavily doped area 20, the N-type lightly doped epitaxial layer 18, the first P-type well 64 and the first N-type heavily doped area 22 can form a punch-through device, and the second P-type heavily doped area 34, the N-type lightly doped epitaxial layer 18, the second P-type well 66 and the third N-type heavily doped area 32 can also form a punch-through device.

Compared to the first embodiment, the third embodiment has lower capacitance and turned-on resistance under ESD stress owing to the first and second P-type wells 64 and 66.

When the first I/O pin receives the positive ESD pulse and the second I/O pin is grounded, the ESD current flows from the first P-type heavily doped area 20 to the fifth N-type heavily doped area 40 through the N-type lightly doped epitaxial layer 18, the first P-type well 64, the first N-type heavily doped area 22, the second N-type heavily doped area 30, the clamp P-type well 28, the P-type heavily doped substrate 16 and the N-type lightly doped epitaxial layer 18. At the same time, the leakage current is induced by the first PNP BJT formed by the first P-type heavily doped area 20, the N-type lightly doped epitaxial layer 18 and the P-type heavily doped substrate 16. However, the first N-type buried area 24 can decrease the β gain of the first PNP BJT to reduce the leakage current greatly. Similarly, when the second I/O pin receives the positive ESD pulse and the first I/O pin is grounded, the ESD current flows from the second P-type heavily doped area 34 to the fourth N-type heavily doped area 38 through the N-type lightly doped epitaxial layer 18, the second P-type well 66, the third N-type heavily doped area 32, the second N-type heavily doped area 30, the clamp P-type well 28, the P-type heavily doped substrate 16 and the N-type lightly doped epitaxial layer 18. At the same time, the leakage current is induced by the second PNP BJT formed by the second P-type heavily doped area 34, the N-type lightly doped epitaxial layer 18 and the P-type heavily doped substrate 16. However, the second N-type buried area 36 can also decrease the β gain of the second PNP BJT to reduce the leakage current greatly.

Figure 7:
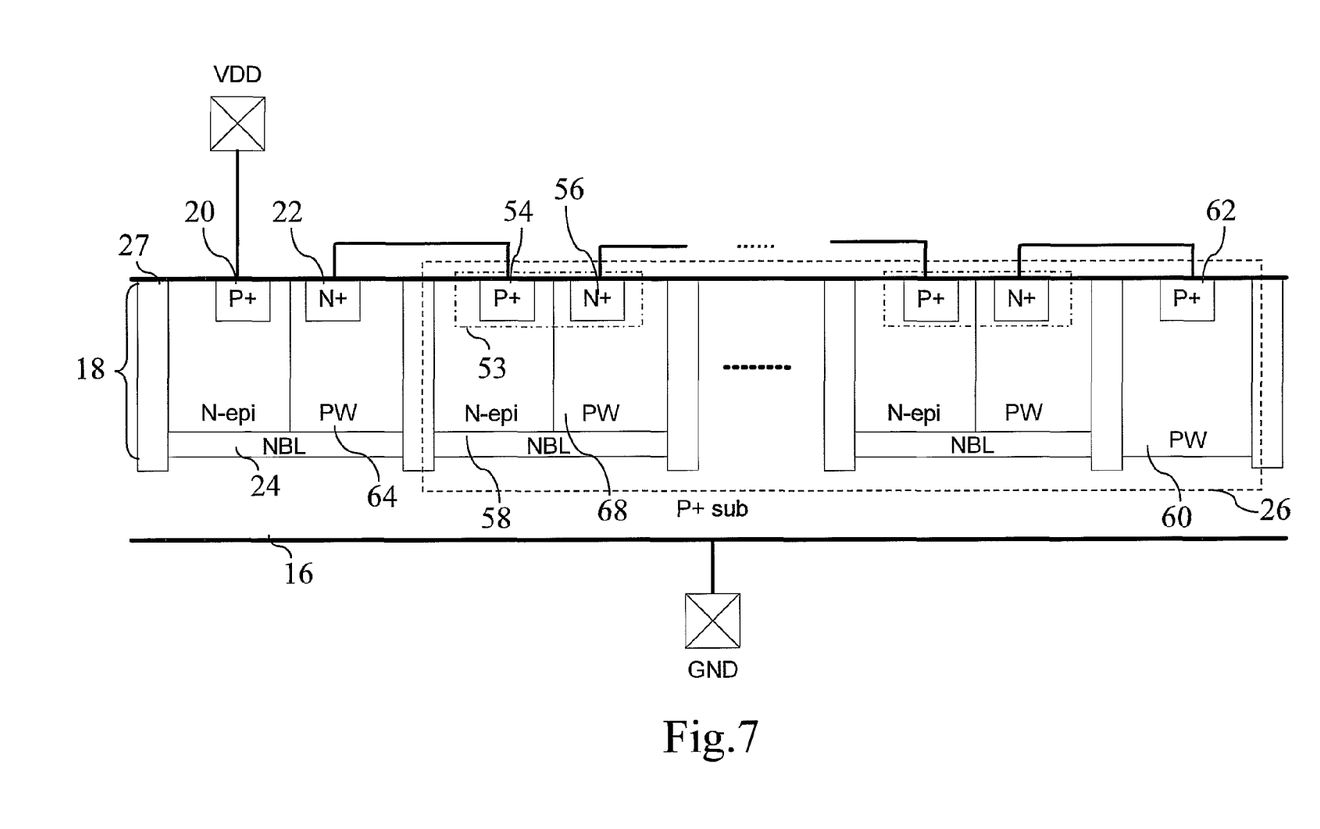
FIG. 7 is a sectional view schematically showing a transient voltage suppressor according to the fourth embodiment of the present invention.

Refer to FIG. 7. Below is the description of the fourth embodiment. The fourth embodiment is different from the second embodiment in the fourth embodiment further comprises a first P-type well 64 and a plurality of third P-type wells 68. The first P-type well 64 is formed in the N-type lightly doped epitaxial layer 18 and located above the first N-type buried area 24, wherein the first N-type heavily doped area 22 is formed in the first P-type well 64. The third P-type wells 68 are formed in the N-type lightly doped epitaxial layer 18 and located above the third N-type buried areas 58, wherein each sixth N-type heavily doped area 56 is respectively formed in one third P-type well 68. In the fourth embodiment, the first P-type heavily doped area 20, the N-type lightly doped epitaxial layer 18, the first P-type well 64 and the first N-type heavily doped area 22 can form a punch-through device, and the third P-type heavily doped area 54, the N-type lightly doped epitaxial layer 18, the third P-type well 68 and the sixth N-type heavily doped area 56 can also form a punch-through device. Compared to the second embodiment, the fourth embodiment has lower capacitance and turned-on resistance under ESD stress owing to the first and third P-type wells 64 and 68. The fourth embodiment can be used as a diode string without leakage current. The diode string can be also used to replace the zener diode 52 in FIG. 6 for low operating voltage application.

When the first P-type heavily doped area 20 receives the positive ESD pulse of the high-voltage pin TDD, the ESD current flows from the first P-type heavily doped area 20 to the P-type heavily doped substrate 16 through the N-type lightly doped epitaxial layer 18, the first P-type well 64, the first N-type heavily doped area 22, the diode structures 53, the fourth P-type heavily doped area 62 and the contact P-type well 60. At the same time, the leakage current is induced by the second PNP BJT formed by the first P-type heavily doped area 20, the N-type lightly doped epitaxial layer 18 and the P-type heavily doped substrate 16, and the leakage current is induced by the third PNP BJTs each formed by the third P-type heavily doped areas 54, the N-type lightly doped epitaxial layer 18 and the P-type heavily doped substrate 16. However, the first N-type buried area 24 and the third N-type buried areas 58 can respectively decrease the β gain of the first PNP BJT and third PNP BJTs to reduce the leakage current greatly.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppressor without leakage current, comprising:

a P-type substrate;

an N-type epitaxial layer formed on said P-type substrate, and a first N-type heavily doped area and a first P-type heavily doped area are formed in said N-type epitaxial layer;

a first N-type buried area formed in a bottom of said N-type epitaxial layer to neighbor said P-type substrate and located below said first N-type heavily doped area and said first P-type heavily doped area;

an electrostatic discharge (ESD) device formed in said N-type epitaxial layer and coupled to said first N-type heavily doped area;

at least one deep isolation trench formed in said N-type epitaxial layer, having a depth greater than a depth of said first N-type buried area, and being adjacent to said first N-type buried area to separate said first N-type buried area and said ESD device;

a clamp P-type well formed in said N-type epitaxial layer, and a second N-type heavily doped area is formed in said clamp P-type well;

a third N-type heavily doped area formed in said N-type epitaxial layer and coupled to said first and second N-type heavily doped areas;

a second P-type heavily doped area formed in said N-type epitaxial layer;

a second N-type buried area, together with said first N-type buried area, located on a horizontal plane and formed in said bottom of epitaxial layer to neighbor said P-type substrate, wherein said second N-type buried area is located below said third N-type heavily doped area and said second P-type heavily doped area;

a fourth N-type heavily doped area formed in said N-type epitaxial layer, wherein said fourth N-type heavily doped area and said first P-type heavily doped area are coupled to a first I/O pin;

a fifth N-type heavily doped area formed in said N-type epitaxial layer, wherein said fifth N-type heavily doped area and said second P-type heavily doped area are coupled to a second I/O pin, and wherein said depth of said deep isolation trench is greater than a depth of said second N-type buried area, and wherein said deep isolation trench is further adjacent to said second N-type buried area to separate said first and second N-type buried areas, said clamp P-type well and said fourth and fifth N-type heavily doped areas; and a second P-type well formed in said N-type epitaxial layer and located above said second N-type buried area, wherein said third N-type heavily doped area is formed in said second P-type well.

2. The transient voltage suppressor without leakage current according to claim 1, wherein said P-type substrate is a P-type heavily doped substrate.

3. The transient voltage suppressor without leakage current according to claim 1, wherein said N-type epitaxial layer is an N-type lightly doped epitaxial layer.

4. The transient voltage suppressor without leakage current according to claim 1, wherein said P-type substrate is floating.

5. A transient voltage suppressor without leakage current, comprising:
- a P-type substrate;
- an N-type epitaxial layer formed on said P-type substrate, and a first N-type heavily doped area and a first P-type heavily doped area are formed in said N-type epitaxial layer;
- a first N-type buried area formed in a bottom of said N-type epitaxial layer to neighbor said P-type substrate and located below said first N-type heavily doped area and said first P-type heavily doped area;
- an electrostatic discharge (ESD) device formed in said N-type epitaxial layer and coupled to said first N-type heavily doped area;
- at least one deep isolation trench formed in said N-type epitaxial layer, having a depth greater than a depth of said first N-type buried area, and being adjacent to said first N-type buried area to separate said first N-type buried area and said ESD device
- a plurality of diode structures formed in said N-type epitaxial layer, wherein each said diode structure further comprises:
  - a third P-type heavily doped area formed in said N-type epitaxial layer; and
  - a sixth N-type heavily doped area formed in said N-type epitaxial layer, and each said diode structure is cascaded via coupling said third P-type heavily doped areas and said sixth N-type heavily doped areas;
- a plurality of third N-type buried areas, together with said first N-type buried area, located on a horizontal plane and formed in said bottom of said N-type epitaxial layer to neighbor said P-type substrate, and each said third N-type buried area is located below one said third P-type heavily doped area and one said sixth N-type heavily doped area; and
- a contact P-type well formed in said N-type epitaxial layer, and a fourth P-type heavily doped area is formed in said contact P-type well and coupled to a last one of said sixth N-type heavily doped areas, and wherein a first one of said third P-type heavily doped areas is coupled to said first N-type heavily doped area, and wherein said depth of said deep isolation trench is greater than a depth of each said third N-type buried area, and wherein said deep isolation trench is further adjacent to each said third N-type buried area to separate said fourth P-type heavily doped area, said first N-type buried area and each said third N-type buried area.

6. The transient voltage suppressor without leakage current according to claim 5, wherein said first P-type heavily doped area is coupled to a high-voltage pin, and said P-type substrate is coupled to a grounded pin.

7. The transient voltage suppressor without leakage current according to claim 5, wherein said first P-type heavily doped area is coupled to a third I/O pin, and said P-type substrate is coupled to a fourth I/O pin.

8. The transient voltage suppressor without leakage current according to claim 5, further comprising a plurality of third P-type wells formed in said N-type epitaxial layer and located above said third N-type buried areas, wherein each said sixth N-type heavily doped area is respectively formed in one said third P-type well.

\* \* \* \* \*